US012553123B2

(12) United States Patent
Shatalov et al.

(10) Patent No.: US 12,553,123 B2
(45) Date of Patent: Feb. 17, 2026

(54) HIGH THROUGHPUT POWDER TREATMENT SYSTEMS

(71) Applicant: CVD Equipment Corporation, Central Islip, NY (US)

(72) Inventors: Maxim S. Shatalov, Mt. Sinai, NY (US); Paul J. Decker, Ridge, NY (US); Samuel J. Wright, Bellport, NY (US); William S. Linss, East Patchogue, NY (US)

(73) Assignee: CVD EQUIPMENT CORPORATION, Central Islip, NY (US)

( * ) Notice: Subject to any disclaimer, the term of this patent is extended or adjusted under 35 U.S.C. 154(b) by 106 days.

(21) Appl. No.: 18/469,141

(22) Filed: Sep. 18, 2023

(65) Prior Publication Data

US 2024/0093354 A1 Mar. 21, 2024

Related U.S. Application Data

(60) Provisional application No. 63/407,766, filed on Sep. 19, 2022.

(51) Int. Cl.
*C23C 14/22* (2006.01)
*C23C 16/44* (2006.01)

(52) U.S. Cl.
CPC ........ *C23C 14/223* (2013.01); *C23C 16/4417* (2013.01)

(58) Field of Classification Search
CPC .............. C23C 14/223; C23C 16/4417; H01L 21/67754; H01L 21/67363
(Continued)

(56) References Cited

U.S. PATENT DOCUMENTS 2,793,117 A 5/1957 Harrison
4,657,743 A 4/1987 Kanno
(Continued)

FOREIGN PATENT DOCUMENTS

EP 0599714 A1 6/1994
EP 3469992 A1 4/2019
(Continued)

OTHER PUBLICATIONS

International Preliminary Report and Written Opinion issued in corresponding International Application No. PCT/US2020/049466 dated Mar. 17, 2022, 12 pages.
(Continued)

*Primary Examiner* — Charlee J. C. Bennett
(74) *Attorney, Agent, or Firm* — Carter, DeLuca & Farrell LLP

(57) ABSTRACT

A system for processing powder includes a process tube connected to load lock chamber via a vacuum valve. The load lock chamber includes first and second stations. Each of the first and second stations is configured to receive a barrel containing powder to be treated. A mechanical transfer mechanism is configured to: move a barrel containing powder to be treated from the first station into the process tube; move a barrel containing powder to be treated from the second station into the process tube; move a barrel containing treated powder from the process tube to the first station; and move a barrel containing treated powder from the process tube to the second station.

11 Claims, 14 Drawing Sheets

(58) Field of Classification Search
USPC .......................................................... 118/716
See application file for complete search history.

(56) References Cited

U.S. PATENT DOCUMENTS

| | | | |
|---|---|---|---|
| 4,769,146 | A | 9/1988 | Schmidt |
| 4,882,223 | A | 11/1989 | Aptel et al. |
| 4,906,581 | A | 3/1990 | Baker et al. |
| 4,997,564 | A | 3/1991 | Herczeg |
| 5,037,383 | A | 8/1991 | Vaslef et al. |
| 5,192,320 | A | 3/1993 | Anazawa et al. |
| 5,192,499 | A | 3/1993 | Sakai et al. |
| 5,368,028 | A | 11/1994 | Palti |
| 5,531,848 | A | 7/1996 | Brinda et al. |
| 6,203,765 | B1 | 3/2001 | Taciuk et al. |
| 6,350,321 | B1 * | 2/2002 | Chan ................. H01L 21/67225 156/345.32 |
| 6,350,411 | B1 | 2/2002 | Cho et al. |
| 6,495,101 | B1 | 12/2002 | Yokoyama et al. |
| 6,667,099 | B1 | 12/2003 | Greiner et al. |
| 7,641,863 | B2 | 1/2010 | Doktycz et al. |
| 8,377,748 | B2 | 2/2013 | Lee et al. |
| 8,425,838 | B2 | 4/2013 | Mizoguchi et al. |
| 8,574,340 | B2 | 11/2013 | Bakker et al. |
| 8,685,319 | B2 | 4/2014 | Olson et al. |
| 8,968,203 | B2 | 3/2015 | Palti |
| 8,992,428 | B2 | 3/2015 | Palti |
| 9,138,522 | B2 | 9/2015 | Palti |
| 9,199,023 | B2 | 12/2015 | Takeuchi |
| 9,233,366 | B2 | 1/2016 | Bakker et al. |
| 9,446,520 | B2 | 9/2016 | Altman et al. |
| 9,663,368 | B2 | 5/2017 | Guzman de Villoria et al. |
| 9,670,060 | B2 | 6/2017 | Dhinojwala et al. |
| 9,724,067 | B2 | 8/2017 | Palti et al. |
| 9,750,431 | B2 | 9/2017 | Palti |
| 9,771,264 | B2 | 9/2017 | Garcia et al. |
| 9,827,534 | B2 | 11/2017 | Palti |
| 10,820,890 | B2 | 11/2020 | Palti |
| 11,197,971 | B2 | 12/2021 | Palti |
| 11,255,841 | B2 | 2/2022 | Palti et al. |
| 2002/0037210 | A1 * | 3/2002 | Matsunaga ............. C23C 16/54 414/416.08 |
| 2004/0052984 | A1 * | 3/2004 | Toth ........................ C23C 24/06 428/34.1 |
| 2005/0181195 | A1 | 8/2005 | Dubrow |
| 2009/0011293 | A1 * | 1/2009 | Wood .................... C23C 14/223 429/479 |
| 2010/0285271 | A1 | 11/2010 | Davis et al. |
| 2011/0220574 | A1 | 9/2011 | Bakajin et al. |
| 2013/0112610 | A1 | 5/2013 | Davis et al. |
| 2013/0244008 | A1 | 9/2013 | Wardle et al. |
| 2014/0088725 | A1 | 3/2014 | Palti |
| 2015/0024374 | A1 | 1/2015 | Palti |
| 2015/0360182 | A1 | 12/2015 | Palti |
| 2018/0036459 | A1 | 2/2018 | Anzai et al. |
| 2018/0036468 | A1 | 2/2018 | Anzai et al. |
| 2018/0079642 | A1 | 3/2018 | Davis et al. |
| 2019/0376182 | A1 | 12/2019 | Neikirk et al. |
| 2020/0055001 | A1 | 2/2020 | Palti |
| 2020/0166413 | A1 * | 5/2020 | Osaka ...................... G01K 1/08 |
| 2021/0393864 | A1 | 12/2021 | Strobl et al. |
| 2023/0132290 | A1 * | 4/2023 | Burrows ............. C23C 16/4417 118/716 |

FOREIGN PATENT DOCUMENTS

| | | | |
|---|---|---|---|
| JP | 2016025958 | A | 2/2016 |
| WO | 2013041950 | A1 | 3/2013 |
| WO | 2021046394 | A1 | 3/2021 |
| WO | 2023121710 | A2 | 6/2023 |
| WO | 2023164043 | A1 | 8/2023 |

OTHER PUBLICATIONS

Feng et al.: "Super-Hydrophobic Surfaces: From Natural to Artificial", Advanced Materials, VCH Publishers, vol. 14, No. 24, Dec. 17, 2002, pp. 1857-1860, 4 pages.

Lathuiliere et al, "Encapsulated Cellular Implants for Recombinant Protein Delivery and Therapeutic Modulation of the Immune System", International Journal of Molecular Sciences, vol. 16, No. 12, May 8, 2015, pp. 10578-10600, 23 pages.

International Search Report and Written Opinion issued in International Application No. PCT/US2020/049466 mailed Nov. 30, 2020, 19 pages.

Li et al., "Densified aligned carbon nanotube films via vapor phase infiltration of carbon", Carbon vol. 45, No. 4, Jan. 30, 2001, pp. 847-851, 5 p.

Poelma et al., "Tailoring the Mechanical Properties of High-Aspect-Ratio Carbon Nanotube Arrays Using Amorphous Silicon Carbide Coatings", Advanced Functional Materials, vol. 24, No. 36, Sep. 24, 2014, pp. 5737-5744, 8 pages.

International Search Report and Written Opinion issued in International Application No. PCT/US2019/059228 mailed Jan. 24, 2020, 25 pages.

International Preliminary Report on Patenability and Written Opinion issued in corresponding International Application No. PCT/US2019/059228 dated May 14, 2021, 15 pages.

Hanna et al., "Mechanical Property Measurement of Carbon Infiltrated Carbon Nanotube Structures for Compliant Micromechanisms", Journal of Microelectromechanical Systems, vol. 23, No. 6, Dec. 2014, pp. 1330-1339.

Ph.D. Thesis by Lawrence Barrett, "High-Aspect-Ratio Metal Microfabrication by Nickel Electroplating of Patterned Carbon Nanotube Forests", Brigham Young University, Aug. 2014, 28 pages.

ISO 7199, Cardiovascular implants and artificial organs—Blood-gas exchangers (oxygenators), Third Edition, Nov. 15, 2016, 20 pages.

FDA Standard, "Guidance for Cardiopulmonary Bypass Oxygenators 510(k) Submissions; Final Guidance for Industry and FDA Staff", Nov. 13, 2000, 23 pages.

Strobl et al., TechConnect 2019 poster titled "c-VACNT™ enabled Fluid Reactor Innovations: a NanotoMacro™ transformation": DOI: 10.13140/RG.2.2.30775.06567.

International Search Report and Written Opinion issued in corresponding International Application No. PCT/US2023/013691 dated May 31, 2023, 12 pages.

* cited by examiner

HIGH THROUGHPUT POWDER TREATMENT SYSTEMS

CROSS-REFERENCE TO RELATED APPLICATIONS

This application claims the benefit of, and priority to, U.S. Provisional Patent Application No. 63/407,766 filed on Sep. 19, 2022, the entire contents of which are hereby incorporated herein by reference.

TECHNICAL FIELD

The systems disclosed herein allow for automatic loading and unloading of batches of powder for treatment using chemical vapor deposition (CVD) or other processing. The present systems increase throughput and reduce the risk of exposure to hazardous gases.

BACKGROUND

Powder processing may be done in a rotary drum reactor. Many types of powder processing require a near-vacuum environment and/or high temperature. As batches of powder are sequentially inserted/removed from the reactor, the reactor conditions must be set up for the next transition. These reactor conditions include heating up, cooling down, evacuating, and backfilling with inert or process gases, etc. The time to set up these conditions increases total cycle time and reduces efficiency/throughput.

It is desirable to substantially maintain conditions inside the reactor as batches of powder are sequentially placed therein, thereby increasing product yield and reducing contamination of the reactor.

SUMMARY

Barrels, pre-loaded with powder substrate material for treatment (e.g., coating), can be automatically loaded from one of a first or second station of a dual load lock chamber into a process chamber. The process chamber may be kept at treatment temperature at all times to increase throughput, requiring no heat up or cool down time.

As the treatment process is finishing on the powder in the currently in-process barrel that was loaded from the first station of the dual load lock chamber, the next powder-containing barrel to be processed may be placed within the second station of the dual load lock chamber, where it is primed, and readied to be loaded from the second station of the load lock chamber into the process chamber. The load lock chamber may be evacuated, and inert gas backfilled (one or several times) to ensure an inert environment prior to opening the process chamber to the load lock chamber. This may be particularly advantageous when the powder to be processed is susceptible to oxidation or corrosion in air, where the process gases that may still be present after a coating run are reactive with air, or where the coated powder within the process chamber is susceptible to oxidation or corrosion with air. Under evacuation, or non-uniform/turbulent backfill, the powder in the barrel(s) that reside in the load lock chamber may be disturbed, potentially leading to elutriation loss (powder carry-over, entrainment). Particles in the powder bed can be secured within the barrels via centrifugal confinement as described, for example, in U.S. Provisional Patent Application No. 63/312,851 filed Feb. 23, 2022 ("the '851 application"), the contents of which are incorporated herein in their entirety by this reference. Alternatively or in addition, an automatically inserted/removed plug can prevent powder loss from the barrels in the load lock chamber during evacuation or non-uniform/turbulent backfill. The plug(s) may be automatically removed when the load lock chamber and process chamber have reached their desired transfer pressure (the steady state pressure at which the barrels are loaded into, or removed from, the process chamber).

Hazardous gases are shut off, and the process chamber is purged and/or evacuated to remove residual hazardous gases therefrom prior to opening.

The fully processed barrel may be automatically unloaded from the process chamber into the unoccupied station of the dual load lock chamber. During the unload operation, the pressure differential between the process chamber and the load lock chamber is minimized in order to avoid or substantially reduce disruption to the powder bed. Alternatively, particles in the powder may be secured via centrifugal confinement while being moved to and stored within the load lock chamber.

The transfer of the barrel from the process chamber to the load lock chamber, or from the load lock chamber to the process chamber, can be performed at atmospheric pressure, sub-atmospheric pressure, or above atmospheric pressure.

An automatic mechanism may be used to swap the barrels, so that the fully processed barrel is now in the first station of the load lock chamber and the unprocessed barrel is in the second station.

The unprocessed barrel residing in the second station of the load lock chamber may be automatically loaded into the process chamber.

An end cap seal may translate on the same assembly as the unprocessed barrel and seal the process chamber from the atmosphere of the load lock chamber.

The process pressure with the sealed process chamber may be atmospheric pressure, sub-atmospheric pressure, or above atmospheric pressure.

In order to allow for rotation of the barrels, as well as loading/unloading from each station of the load lock chamber, the barrels either:

a. can be inserted and coupled into static bearing housing/housings via motion (e.g., a linear load/unload motion); or b. the barrels themselves have bearing housings pre-attached and can simply be raised/lowered into position.

The first station of the load lock chamber is a holding bay for the barrel that allows for either pre-heat up to process temperature (or some intermediate temperature) prior to loading into the process chamber, or for cooldown prior to offloading from the load lock chamber.

The second station of the load lock chamber is an assembly with linear translation capability that moves the barrel into and out of the process chamber.

A gate valve (such as, for example, a vacuum valve) isolates the process chamber from the load lock chamber whenever the end cap is fully retracted.

The previously processed barrel may be allowed to cool in an inert atmosphere while in the first station of the load lock chamber. This occurs while the next barrel is in process, resulting in increased throughput.

A mechanism within the load lock chamber can accept a barrel ready to process, park it in an idle location, remove the completed barrel from the process chamber, park the completed barrel for cooling off, and insert the new barrel into the process chamber, all automatically via a combination of rotary, linear, and latching mechanisms.

The load lock chamber may have a heater, so that the next barrel to be loaded into the process chamber can be preheated up to the temperature of the process chamber (or some intermediate temperature) while the barrel in the process chamber is currently in process. This reduces the heat up time for the next barrel when it is loaded into the process chamber, further increasing throughput of the system.

The present systems may be operated in a manner that provides centrifugal confinement of the powder within the barrel to avoid or substantially reduce powder elutriation loss (powder carry-over, entrainment). See, the '851 application.

In embodiments, systems in accordance with the present disclosure have a fixed gas injector, thermocouple, exhaust, and rotation feedthrough/coupling. These can be cantilevered from the load end of the process chamber, or from the opposite end, or a combination. The barrels can slide over hardware that is cantilevered from either end of the process chamber during load/unload. In embodiments, the present systems include a fixed injector and exhaust at the same end of the process chamber without concern for interference with a filter element, for example, as shown in the '851 application. Centrifugal confinement (see the '851 application) mitigates particle elutriation losses so that the automatically loaded barrel designs in accordance with this disclosure can be simplified and made to be more robust by allowing for fixed injection and exhaust (rather than some mating coupling or more complex gas routing design that may be more susceptible to leaks or particulate contamination).

A fixed gas injector, aligned with the center axis of the barrel, injects the process gases for the powder treatment process. In embodiments, the injection holes are pointing upwards (against gravity) such that the process gases are directed into the dispersed particles as they fall from the top of the rotating barrel in a cataracting motion. Such injector design promotes treatment uniformity on the individual particles that form the powder.

A comb with retractable tines may be incorporated (see the '851 application). This retractable comb is designed to be compatible with the automatically loaded and unloaded barrels. In one embodiment, the comb (that is cantilevered from one end of the process chamber) engages with and retracts from the particle bed via rotary motion. In another embodiment, the pivoting comb is weighted so that in the cataracting condition, the comb engages with the particle bed and in the centrifuging condition the force due to increased angular momentum of the powder bed pushes the comb out of the way allowing the particles to centrifuge. The mechanism can be a weight, a spring, or some other force. In another embodiment, the comb has pneumatically actuated tines that engage and disengage with the powder bed.

Barrels may be on axis with rotation (concentric), or rotation may be off-axis (eccentric) to increase the centrifugal force on the powders for centrifugal confinement. Off-axis (eccentric) rotation may also help for gas injection and uniform treatment of powders.

The system may have a horizontal orientation, and a linear drive mechanism employed to load and unload the barrels from the room to the load lock chamber, and from the load lock chamber to the process chamber.

The load lock chamber may also interface with multiple process chambers for parallel processing, to further increase throughput.

BRIEF DESCRIPTION OF THE DRAWINGS

The present disclosure may be understood by reference to the accompanying drawings, when considered in conjunction with the subsequent, detailed description, in which.

DETAILED DESCRIPTION

Figure 1:
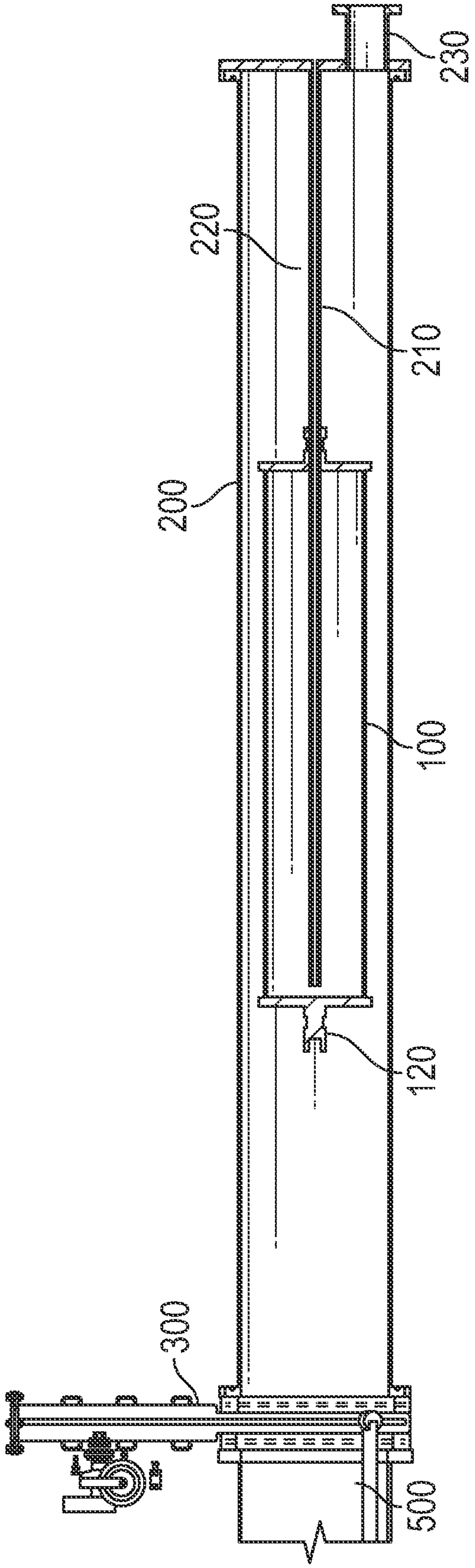
FIG. 1 schematically shows a process tube suitable for use in systems in accordance with this disclosure.

Embodiments of the presently disclosed powder treatment systems are described in detail with reference to the drawings, in which like reference numerals designate identical or corresponding elements in each of the several views. In the following description, well-known functions or constructions are not described in detail to avoid obscuring the present disclosure in unnecessary detail.

Reference is made in detail to specific embodiments, one or more examples of which are illustrated in the drawings. Each example is provided by way of explanation, not limitation. It will be apparent to those skilled in the art that various modifications and variations may be made in the embodiments without departing from the scope or spirit of the disclosure. For instance, features illustrated or described as part of one embodiment may be used with another embodiment to yield a still further embodiment. Thus, it is intended that the present disclosure covers such modifications and variations as come within the scope of the appended claims and their equivalents.

While the following description is directed to the exemplary powder treatment systems shown in the figures, it should be understood that the structures and methods described herein may be used in connection with any powder treatment system, especially systems designed for applying materials (e.g., a coating, a nanotube, etc.) to particles, such as, for example a chemical vapor deposition (CVD) system, a physical vapor deposition (PVD) system, a plasma deposition system, an electrochemical deposition system, a molecular layer deposition system, or an atomic layer deposition system. Other types of powder treatment systems with which the present structures and methods may be used or adapted for use will be readily apparent to one skilled in the art reading this disclosure.

Directional terms such as top, bottom, and the like are used simply for convenience of description and are not intended to limit the disclosure attached hereto. Also, as used herein, the term “on” includes being in an open or activated position, whereas the term “off” includes being in a closed or inactivated position. As used herein, the terms “first”, “second”, and “third” may be used interchangeably to distinguish one component from another and are not intended to signify location or importance of the individual components.

As seen in FIG. 1, systems in accordance with the present disclosure may include a rotatable barrel 100 containing powder positioned within a process chamber, e.g., process tube 200. Process tube 200 is connected to load lock chamber 500 via a gate valve, such as vacuum valve 300. Process tube 200 is also provided with a stationary thermocouple 210, a stationary gas injector 220, and an exhaust port 230. Barrel 100 includes a rotary shaft connection 120.

Process tube 200 is a vacuum chamber in which the treatment processes (e.g., CVD, sputtering, electron beam evaporation, thermal evaporation, etc.) take place. Load lock chamber 500 is essentially an auxiliary, secondary vacuum chamber attached to process tube 200 with vacuum valve 300 between the chambers. Load lock chamber 500 has its own high vacuum pumping system and venting (not explicitly shown). It contains two (or more) stations each configured for receiving a barrel containing powder to be treated. A mechanical transfer mechanism is provided to move barrels to and from process tube 200. Load lock chamber 500 reduces the cycle time of processing powder and reduces the potential for contamination in process tube 200. Barrels 100 are loaded into the load lock chamber 500 while at atmospheric pressure and temperature, and may contain air. Barrel 100 within load lock chamber 500 may then be preheated, load lock chamber 500 pumped down to a high vacuum pressure, and filled with an inert gas. Vacuum valve 300 is then opened between load lock chamber 500 and the process tube 200. Barrel 100 is then mechanically transferred from load lock chamber 500 to process tube 200 by means of a linear transfer mechanism. After the powder is processed, barrel 100 is transferred back to load lock chamber 500. During this process, the process tube 200 is always under vacuum and maintained at or near treatment temperature. Thus, load lock chamber 500 allows powder to be transferred into the process tube 200 without venting process tube 200 to atmosphere.

Treatment of powder within barrel 100 occurs within process tube 200. In embodiments, treatment of powder can be achieved as described in the ’851 application. As described therein, the system may vary the speed of rotation of barrel 100 (which is essentially a rotary treatment vessel) containing the powder to be treated depending upon the presence or absence of net gas flow through the barrel 100 or process tube 200 at different stages of the treatment process. During treatment stages where gas flow may be present (e.g. pump down), barrel 100 is spun at a centrifugal speed. During treatment stages where net gas flow may be minimal or introduced into barrel 100 in such a way as to avoid or substantially minimize disturbance of the particles, the rotational speed of barrel 100 is at a cataracting speed, which is less than a centrifugal speed. Cataracting (with or without a comb) is the condition under which the uniform processing (heat treatment, surface modification, thin film deposition, etc.) should take place for best results. This is also the condition that is most susceptible to elutriation since the fine powder particles are distributed evenly and falling throughout barrel 100 by design and therefore are easily entrained in any net gas or vapor flow through the reactor. Entrained particles may be elutriated out with the exhaust resulting in yield loss or equipment issues including contamination of valves, clogging of filters, etc. By ensuring that, during treatment stages, any net gas flow may be minimal or introduced into barrel 100 in such a way as to avoid or substantially minimize disturbance of the particles, elutriation losses or equipment issues are avoided or substantially reduced.

Figure 2:
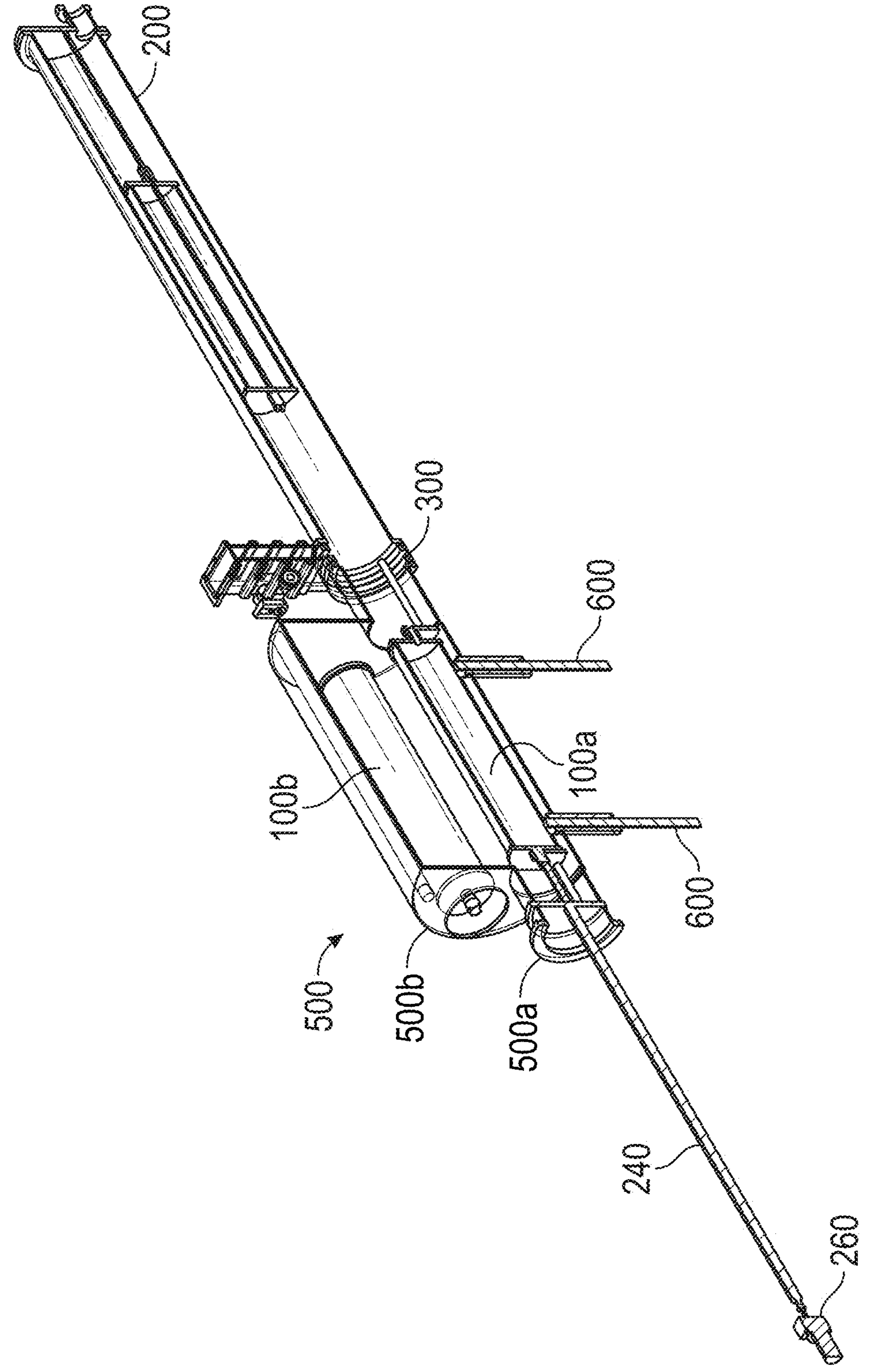
FIG. 2 schematically shows an automatic loading mechanism suitable for use in systems in accordance with this disclosure.

As seen in FIG. 2, automated, sequential loading of barrel 100 into process tube 200 is achieved using load lock chamber 500. Load lock chamber 500 can accommodate two barrels 100*a* and 100*b* at first station 500*a* and second station 500*b*, respectively, and is thus sometimes referred to herein as a dual load lock chamber. A barrel rotation shaft 240 is provided to engage the rotary shaft connection 120 on barrel 100*a* to automatically advance barrel 100*a* into process tube 200, and rotate barrel 100*a* during the treatment process, for example as described in the ’851 application. Rotation of barrel rotation shaft 240 is achieved by motor 260. While barrel 110*a* is undergoing treatment within process tube 200, barrel 100*b* is loaded into load lock chamber 500, where it is prepared for treatment by pre-heating and replacing air with a suitable atmosphere for treatment such as, for example, inert gas. A barrel lift mechanism 600 positions barrels 100*a*, 100*b* for loading into process tube 200.

Figure 3:
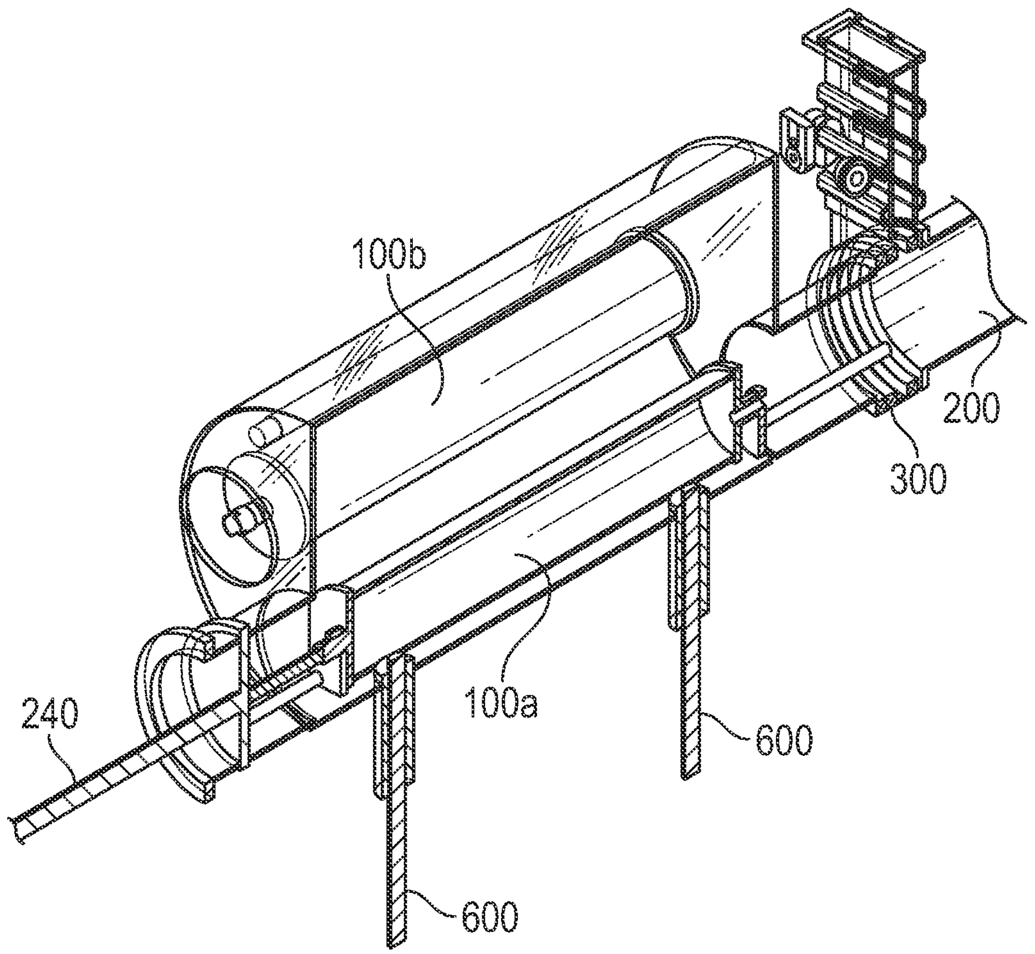
FIG. 3 schematically shows a dual barrel load lock chamber suitable for use in systems in accordance with this disclosure.

As seen in FIG. 3, barrels 100*a*, 100*b* are positioned within dual load lock chamber 500. Advantageously, fresh barrel 100*b* with powder can be loaded into load lock chamber 500 at room temperature. Load lock chamber 500 can then be evacuated to vacuum (to remove air) and backfilled with inert gas. Load lock chamber 500 can also be preheated prior to loading hot barrel 100*b* into the process tube. Barrel 100*a* with treated powder can be unloaded into the load lock chamber 500 without the need to cool down to low temperature within process tube 200, but rather can cool down to room temperature within load lock chamber 500 during treatment of powder within barrel 100*b* (which is automatically loaded into process tube 200 after removal of barrel 100*a* from process tube 200). Since treatment time typically exceeds cool down time, while barrel 100*b* is undergoing treatment, barrel 100*a* can be removed from load lock chamber 500 and a third barrel (not shown) with powder can be pre-loaded into load lock chamber 500 and prepared for treatment once treatment of the powder within barrel 100*b* is complete.

Figure 4:
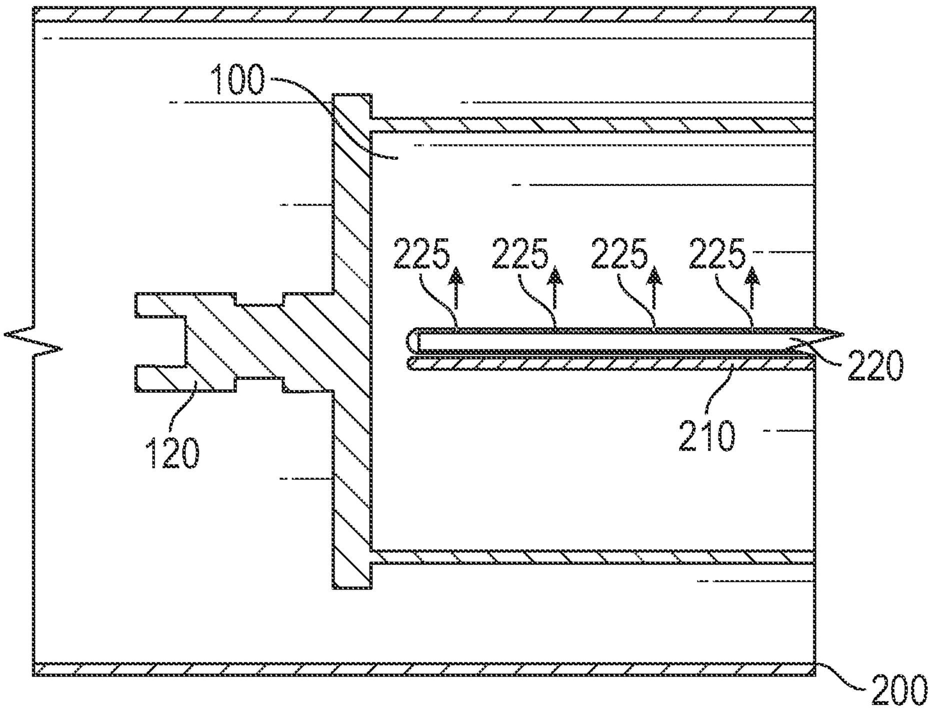
FIG. 4 schematically shows a gas injector line and thermocouple suitable for use in systems in accordance with this disclosure.

As seen in FIG. 4, the inlet side of barrel 100 receives stationary gas injector line 220, that includes a plurality of holes 225 on the top for injection of gas upward into barrel 100, where particles are more fluidized due to rotation (see the '851 application).

Figure 5:
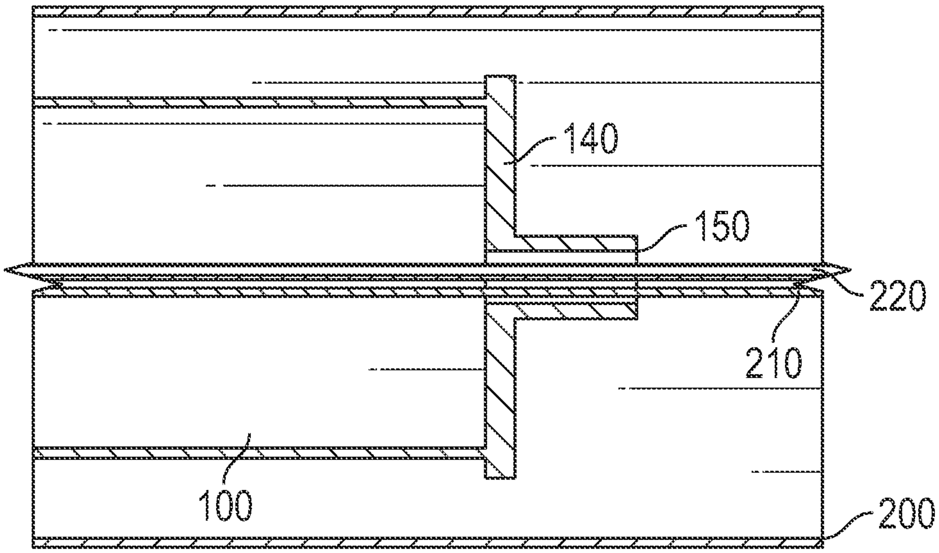
FIG. 5 schematically shows the outlet side of a barrel suitable for use in systems in accordance with this disclosure.

As seen in FIG. 5, the outlet side of barrel 100 may have gaps 150 in barrel end cap 140 between rotating parts and stationary injector 220 and thermocouple 210. These gaps 150 can be used as the internal exhaust port from the barrel when powder is confined using centrifugal confinement as described in the '851 application.

Figure 6:
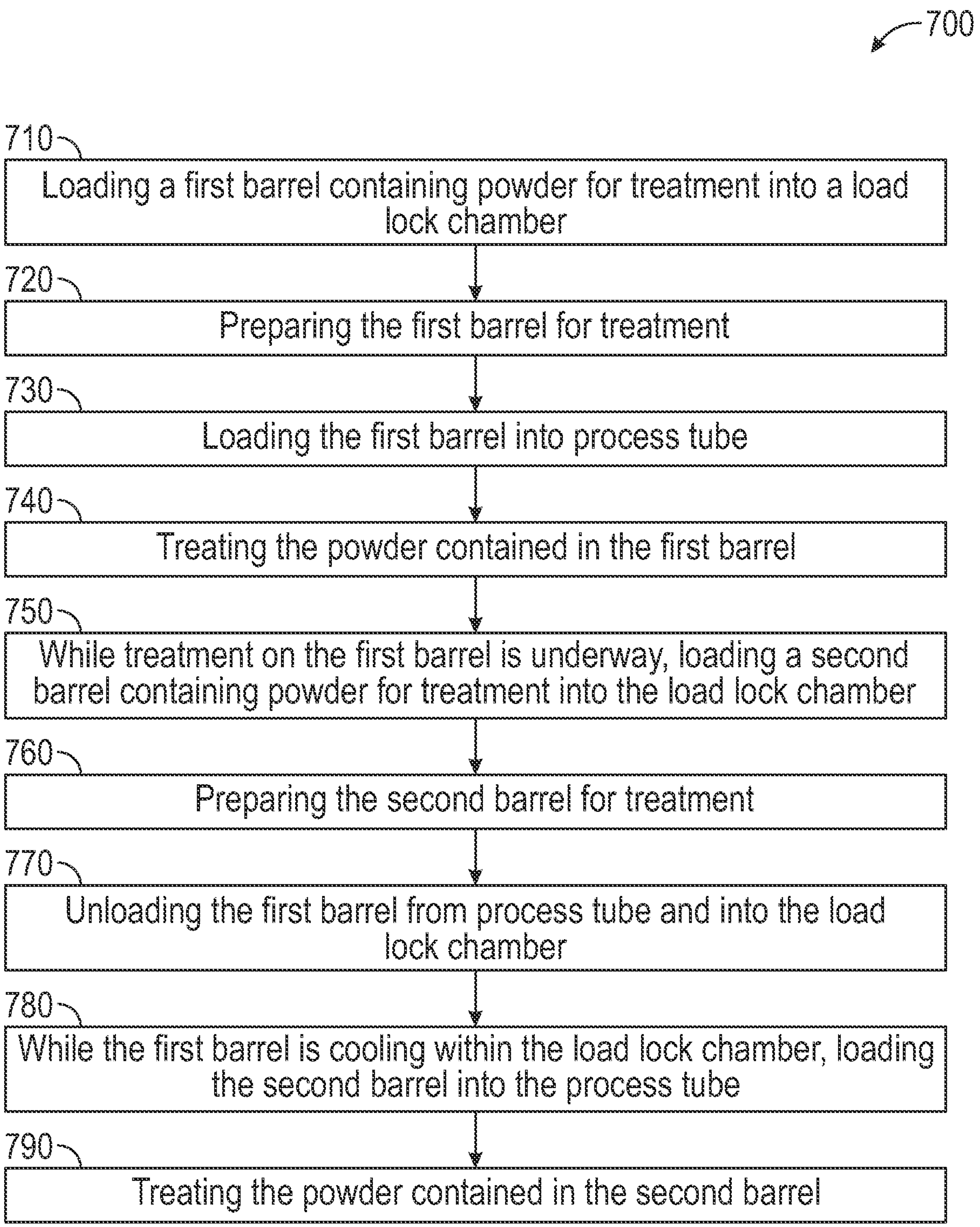
FIG. 6 is a flow chart showing an illustrative method of powder processing in accordance with this disclosure.

In aspects, the present disclosure relates to methods of powder treatment. FIG. 6 shows a flow chart for an illustrative method (700). The methods include loading a first barrel containing powder for treatment into a load lock chamber (710). Once loaded, the first barrel is prepared for treatment (720). Preparation for treatment may include pre-heating and/or introduction of inert gas. Once prepared, the first barrel is loaded into a process tube (730). Treatment of the powder within the process tube is then carried out (740). While treatment on the first tube is underway, the method includes loading a second barrel containing powder for treatment into the load lock chamber (750). Once loaded, the second barrel is prepared for treatment (760). Preparation for treatment may include pre-heating and/or introduction of inert gas. After treatment of the powder in the first barrel is complete, it is transferred back to the load lock chamber for cooling (770). While the first barrel is cooling, the second barrel is loaded into the process tube (780) where treatment of the powder contained in the second barrel is achieved (790). The steps of the method can then be repeated any desired number of times with third, fourth, fifth, etc. barrels. It should, of course, be understood that one or more of the previously described method steps can be achieved automatically by one or more controllers.

Figure 7:
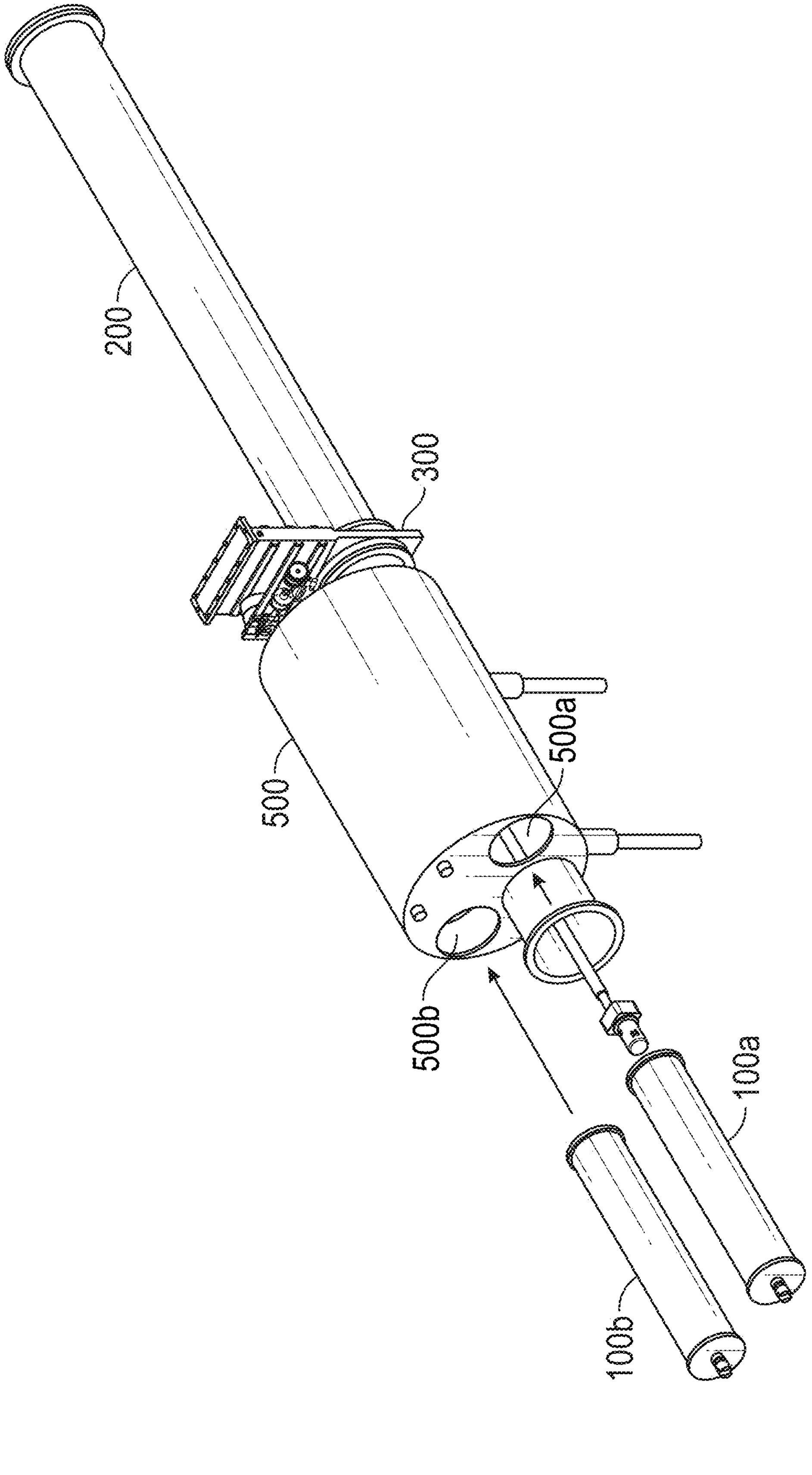
FIG. 7 shows the loading of barrels into a load lock chamber in an illustrative method of powder processing in accordance with this disclosure.

FIGS. 7-13 show a sequence of steps in an example process in accordance with the present disclosure. As seen in FIG. 7, load lock chamber 500 is initially empty of barrels and at atmospheric pressure. Hinged doors (not shown) of load lock chamber 500 are opened and one or more barrels 100*a*, 100*b* are slid/rolled into load lock chamber 500 directly onto transfer arms 550*a*, 550*b*.

Figure 8:
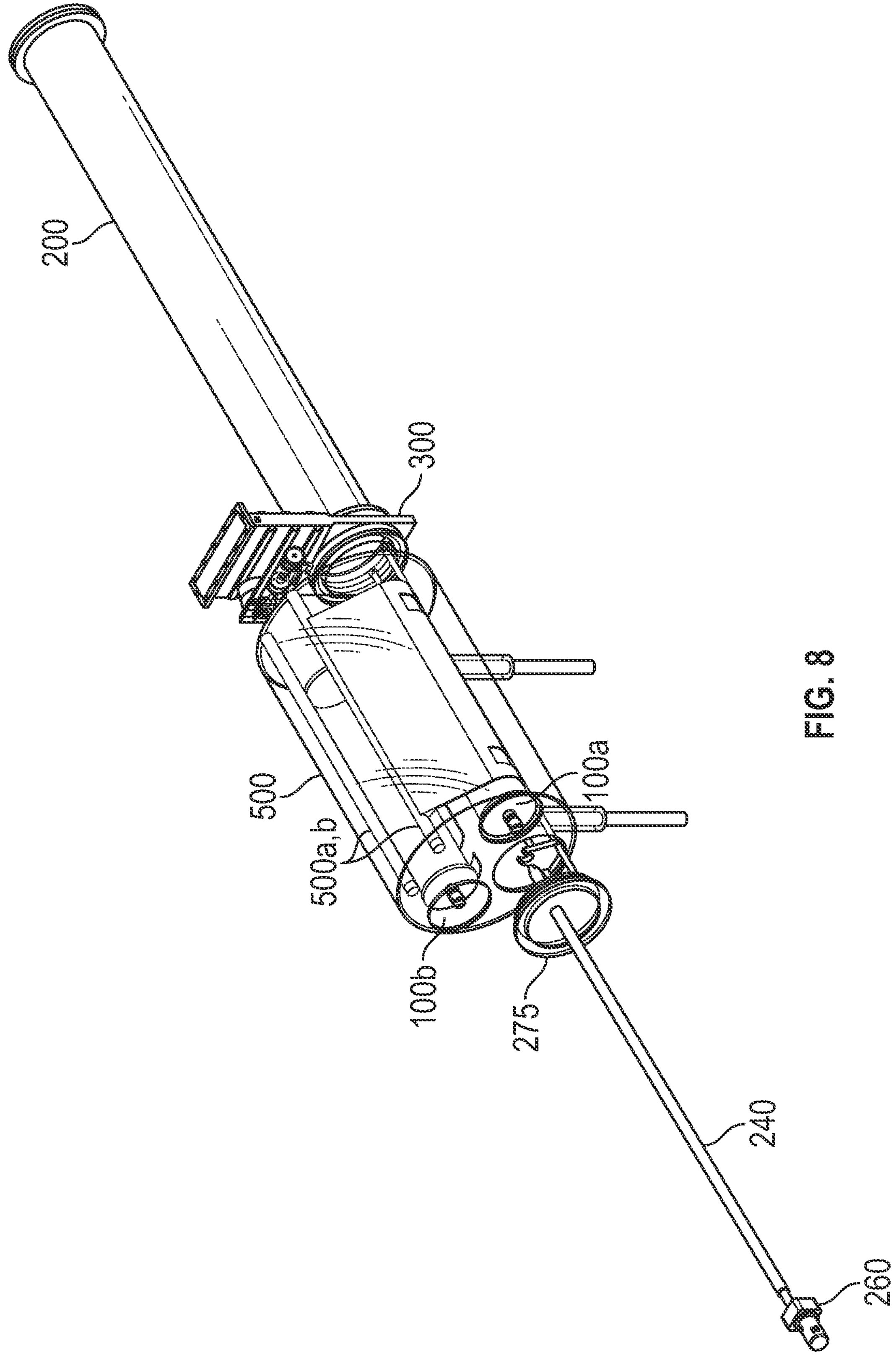
FIG. 8 shows the preparing of barrels for treatment in the load lock chamber in an illustrative method of powder processing in accordance with this disclosure.

Referring to FIG. 8, barrels 100*a*, 100*b* are positioned in transfer arms 550*a*, 550*b* and the hinged doors (not shown) are closed to seal load lock chamber 500 which can then be evacuated. End cap 275 of process tube 200 is positioned within load lock chamber 500 when barrel rotation shaft 240 and rotation motor 260 are fully retracted (all the way towards left in FIG. 8).

Figure 9:
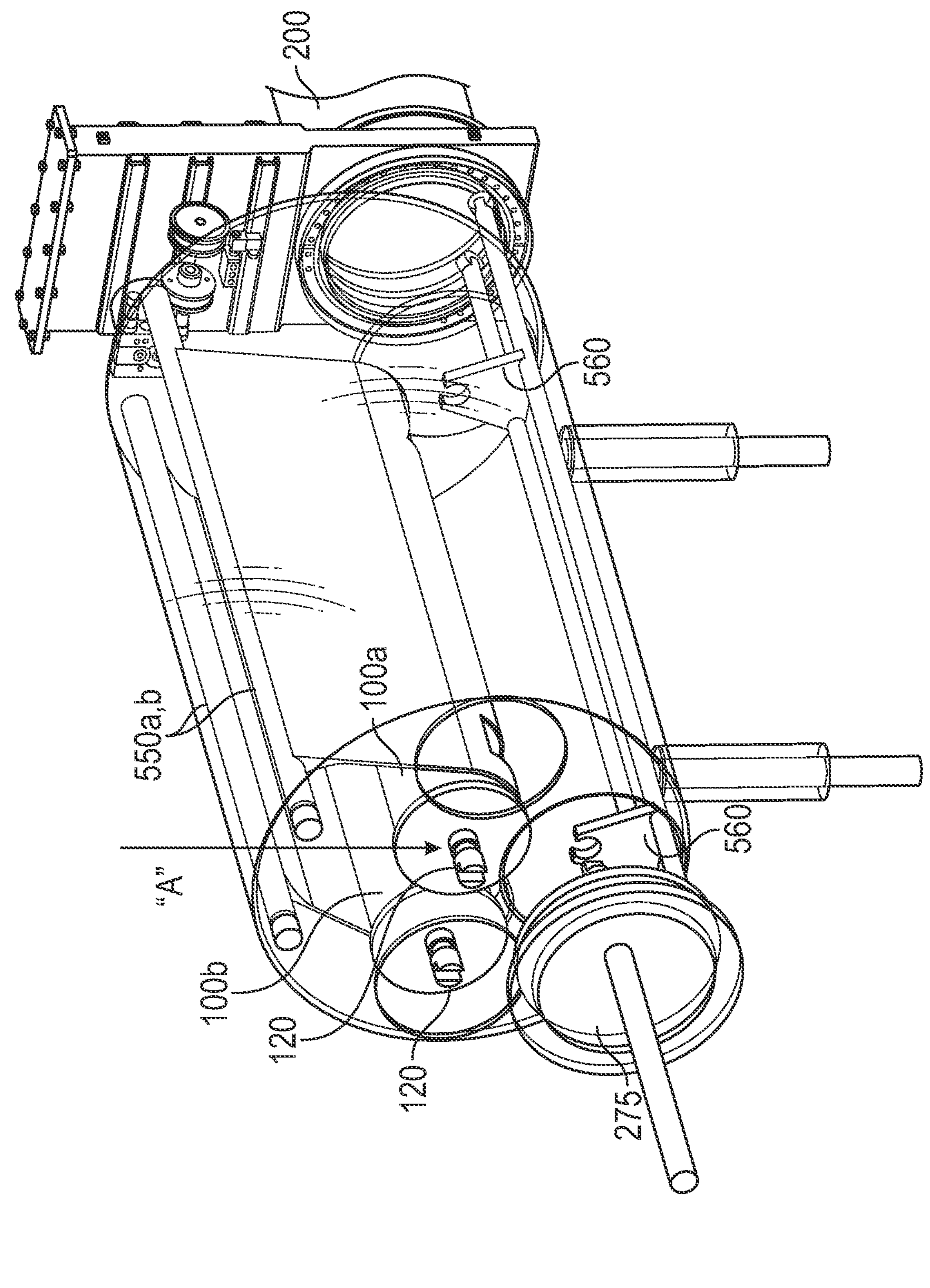
FIG. 9 shows the positioning of barrels by a transfer arm for transfer from the load lock chamber and into the process tube in an illustrative method of powder processing in accordance with this disclosure.

In FIG. 9, transfer arm 550*a* swings barrel 100*a* to the center plane of load lock chamber 500 (arrow "A"), directly over receiving fixtures 560 mounted to end cap 275.

Figure 10:
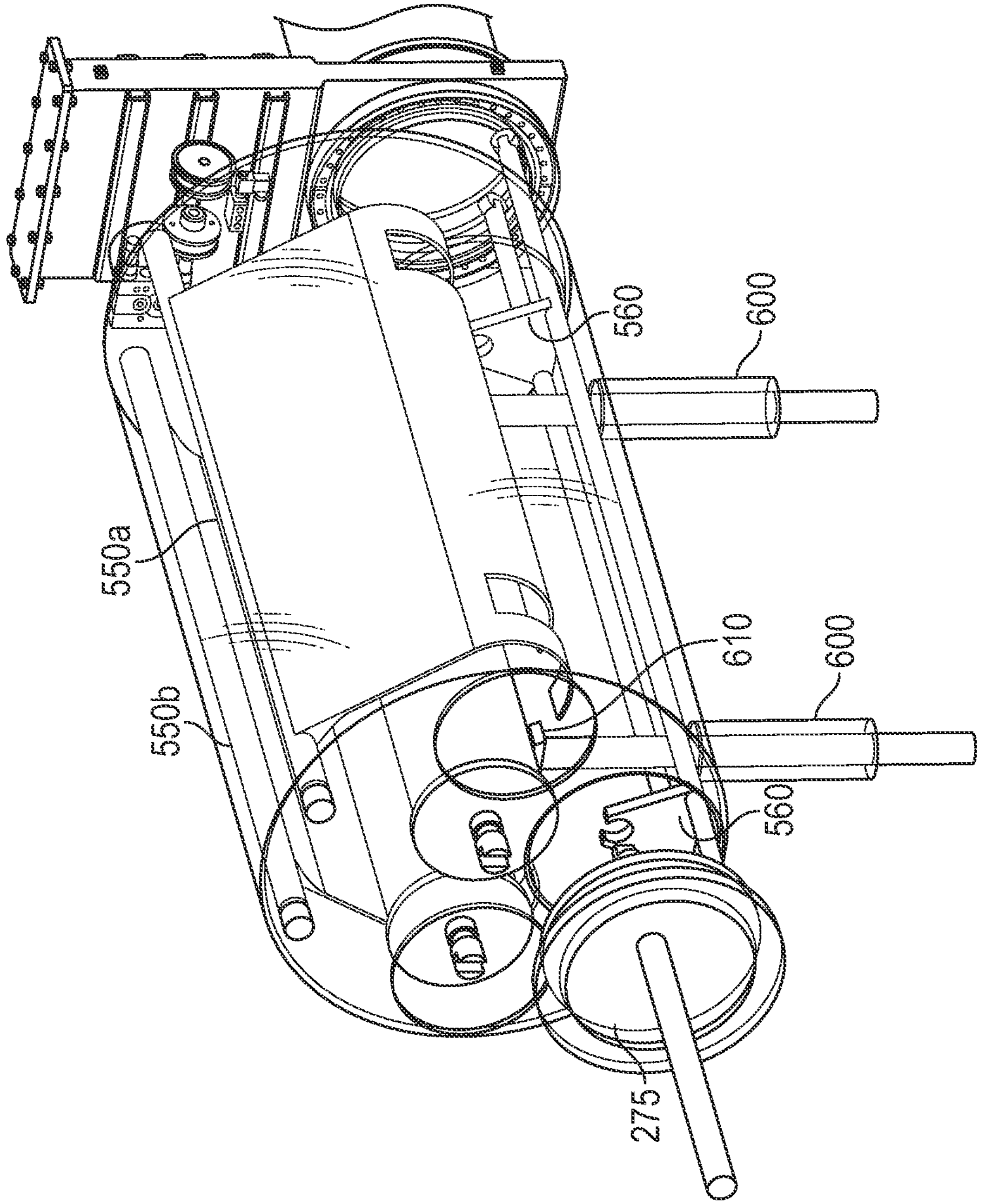
FIG. 10 shows the positioning of barrels onto elevators for movement into position for transfer from the load lock chamber and into the process tube in an illustrative method of powder processing in accordance with this disclosure.

As seen in FIG. 10, elevators 610 come up to receive barrel 100*a* from transfer arm 550*a*. Transfer arm 550*a* retracts toward the side of load lock chamber 500, so that barrel 110*a* (now supported on elevators 610) is free to move into position for loading into process tube 200.

Figure 11:
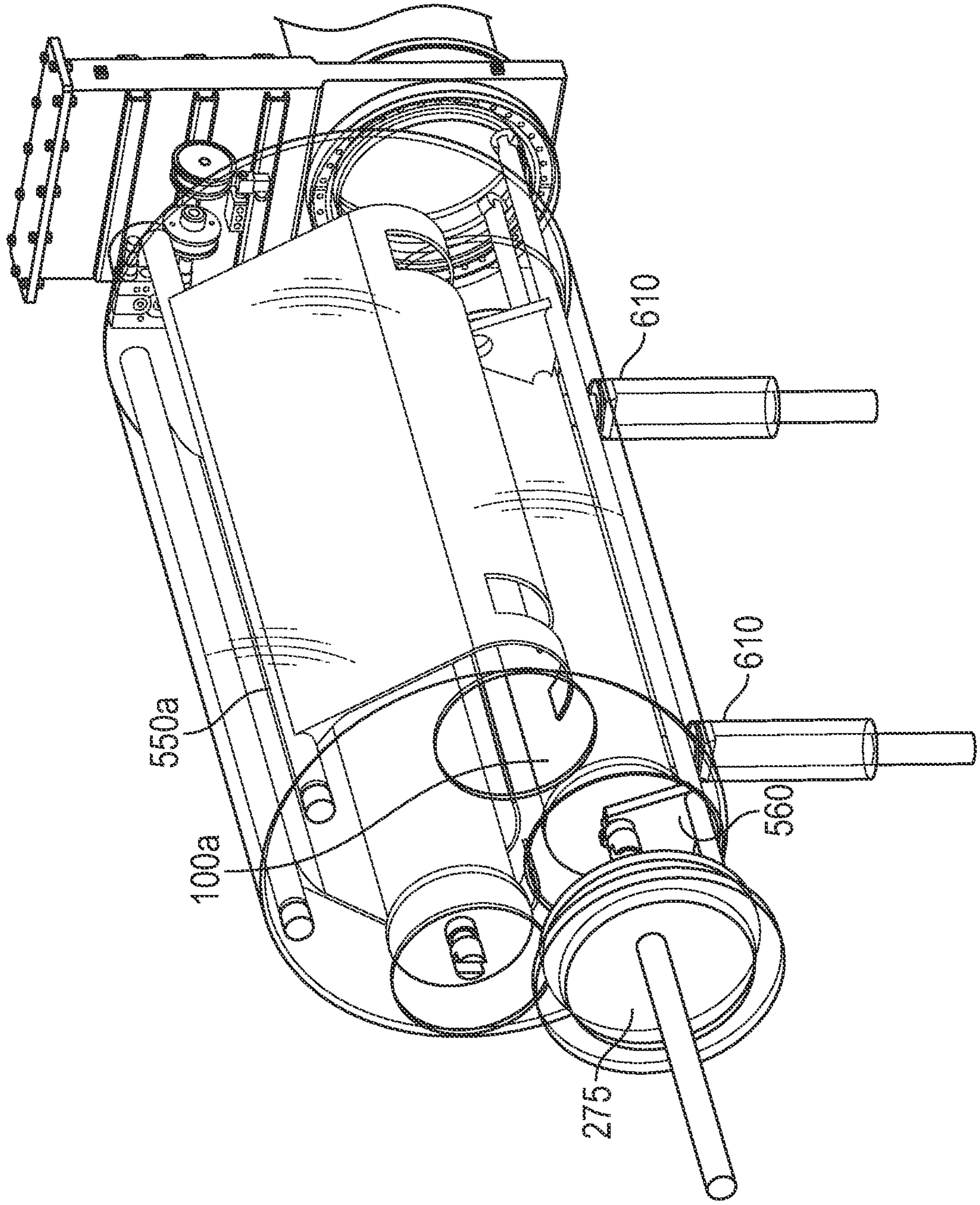
FIG. 11 shows the positioning of barrels by elevators into position for transfer from the load lock chamber and into the process tube in an illustrative method of powder processing in accordance with this disclosure.

In FIG. 11, elevator 610 lowers barrel 100*a* into receiving fixtures 560. Elevators 610 lower further below receiving fixtures 560 to allow barrel 100*a* and receiving fixtures 560 to move laterally into process tube 200 (to the right in FIG. 11).

Figure 12:
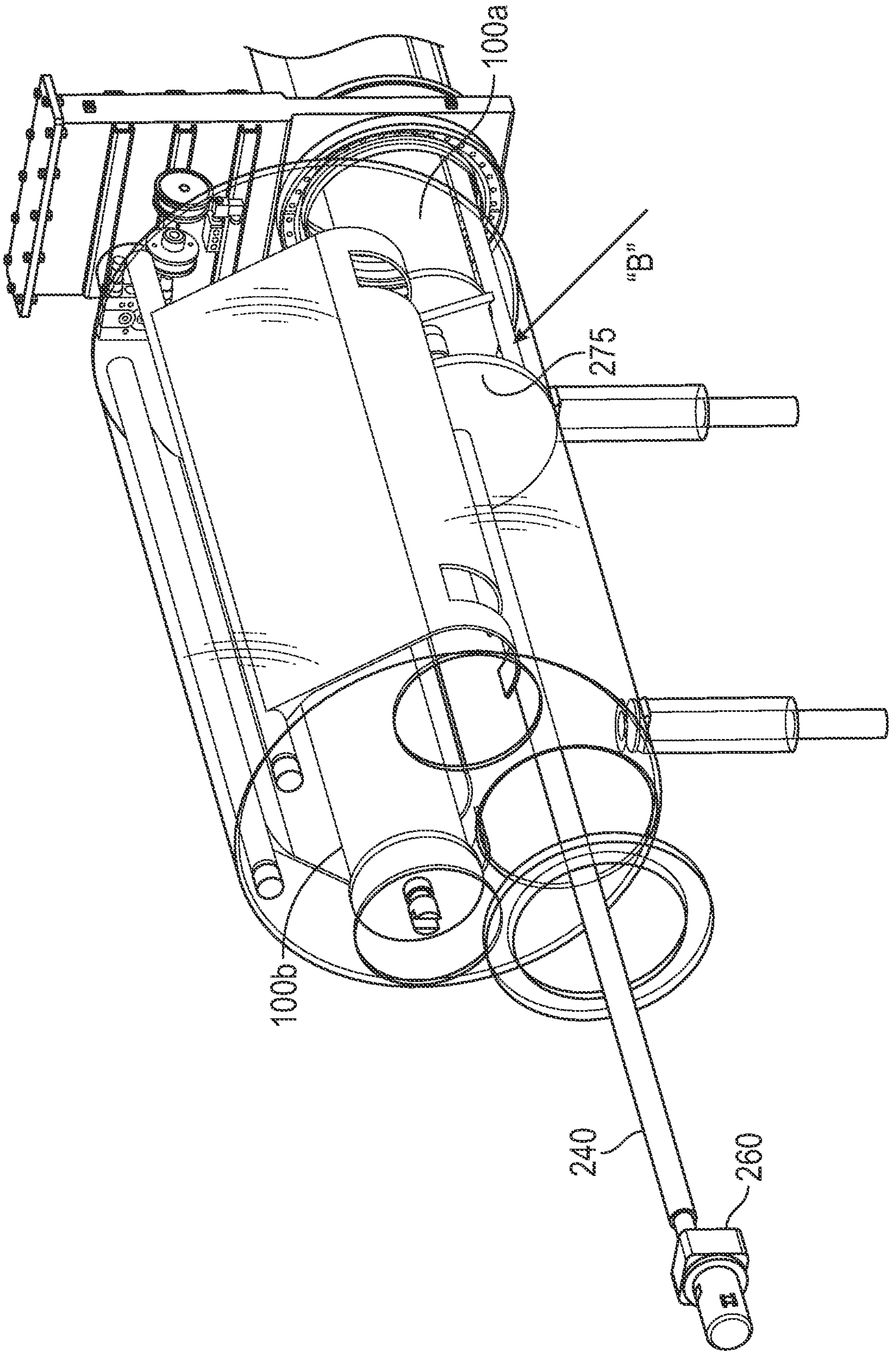
FIG. 12 shows a barrel partially loaded into the process tube in an illustrative method of powder processing in accordance with this disclosure.

FIG. 12 shows end cap 275 with receiving fixtures 560 and barrel 100*a* partially loaded (arrow "B") into process tube 200.

Figure 13:
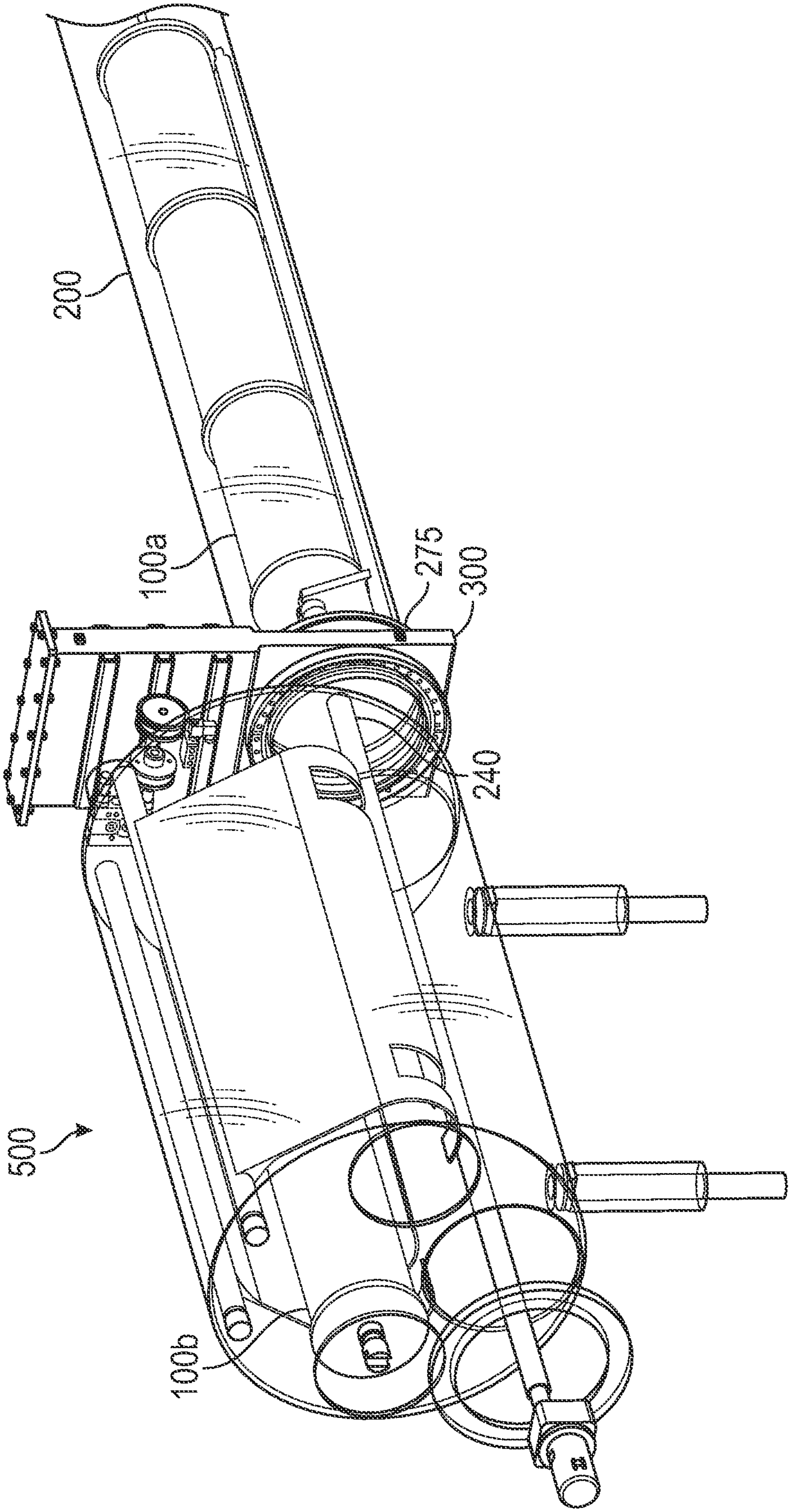
FIG. 13 shows a barrel fully loaded into the process tube in an illustrative method of powder processing in accordance with this disclosure.

As seen in FIG. 13, end cap 275 passes through vacuum valve 300 and seals to a flange of process tube 200 (now shown transparent). Barrel rotation motor 260 never enters load lock chamber 500. There is a linear seal for barrel rotation shaft 240 as it passes through the end of load lock chamber 500. The process tube 200 is evacuated and other steps are taken to prepare it for processing of the powder.

When processing of the powder is complete, end cap 275 moves back through and to the far side of load lock chamber 500 (left in the Figures), elevators 610 and load arms 550*a*, 550*b* shuffle around, removing processed barrel 100*a* away from the center line of process tube 200 and loading the next barrel 100*b* onto receiving fixtures 560. Loading and processing sequences are then repeated.

While this second barrel 100*b* is in process, the first barrel 100*a* is cooling. The load lock chamber 500 (which has been under vacuum since after the hinged barrel doors closed) can be brought back to atmospheric pressure, hinged door (not shown) opened, first barrel 100*a* removed, and a third barrel (not shown) introduced into load lock chamber 500 in the location from which barrel 100*a* was removed.

Figure 14:
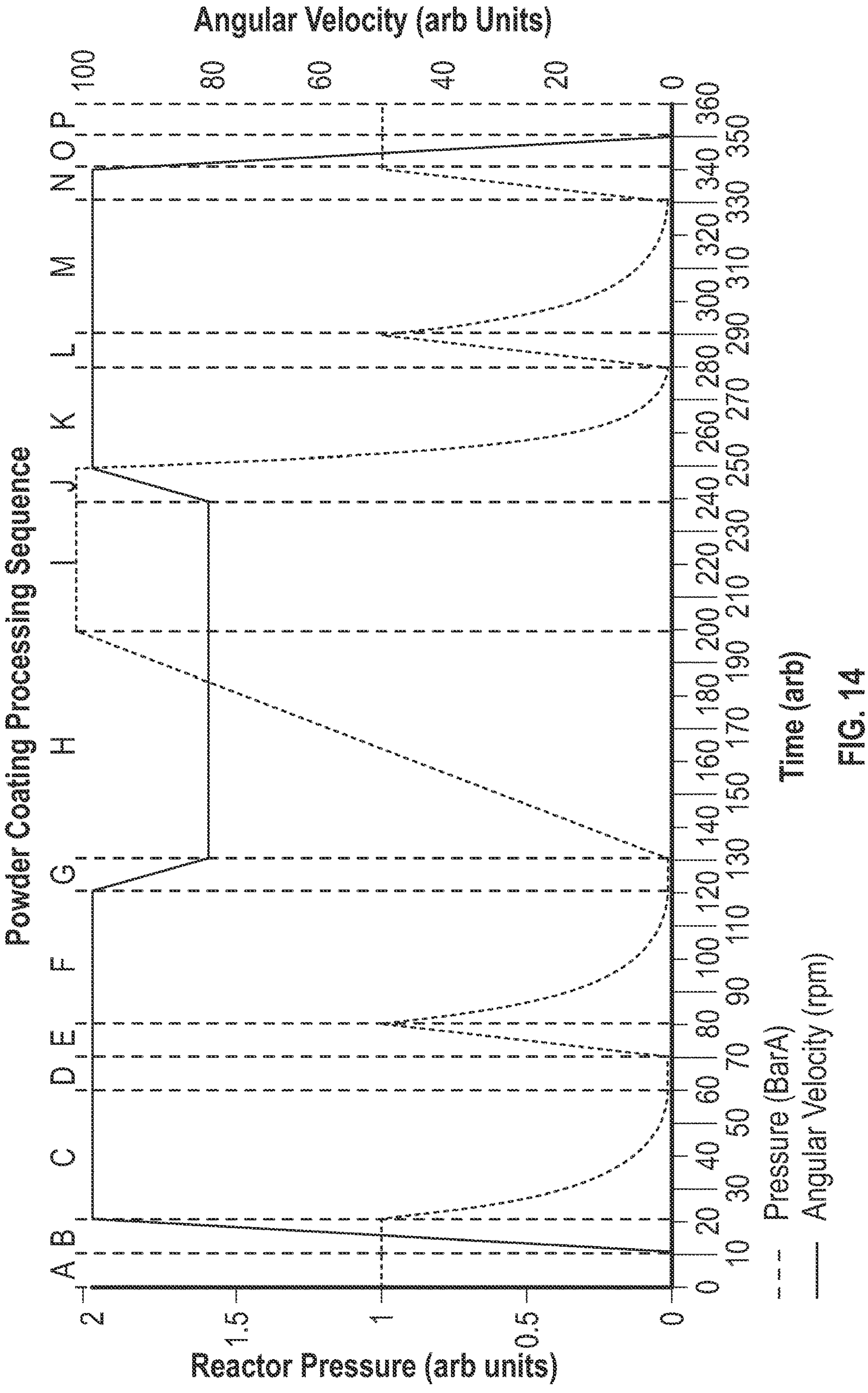
FIG. 14 illustrates variations of the reactor pressure and barrel angular velocity at various steps of an exemplary process in accordance with this disclosure.

Any variety of treatment processes may be employed to treat powder within the barrel once it is loaded into the process chamber. These various processes may involve treatment sequences during which treatment temperature, pressure, and the flow of process gas (or gases) can be varied over time. Many such process variations are within the purview of those skilled in the art. FIG. 14 shows the variations of the reactor pressure and angular velocity when an exemplary treatment process in accordance with the present disclosure is performed.

Figure 15:
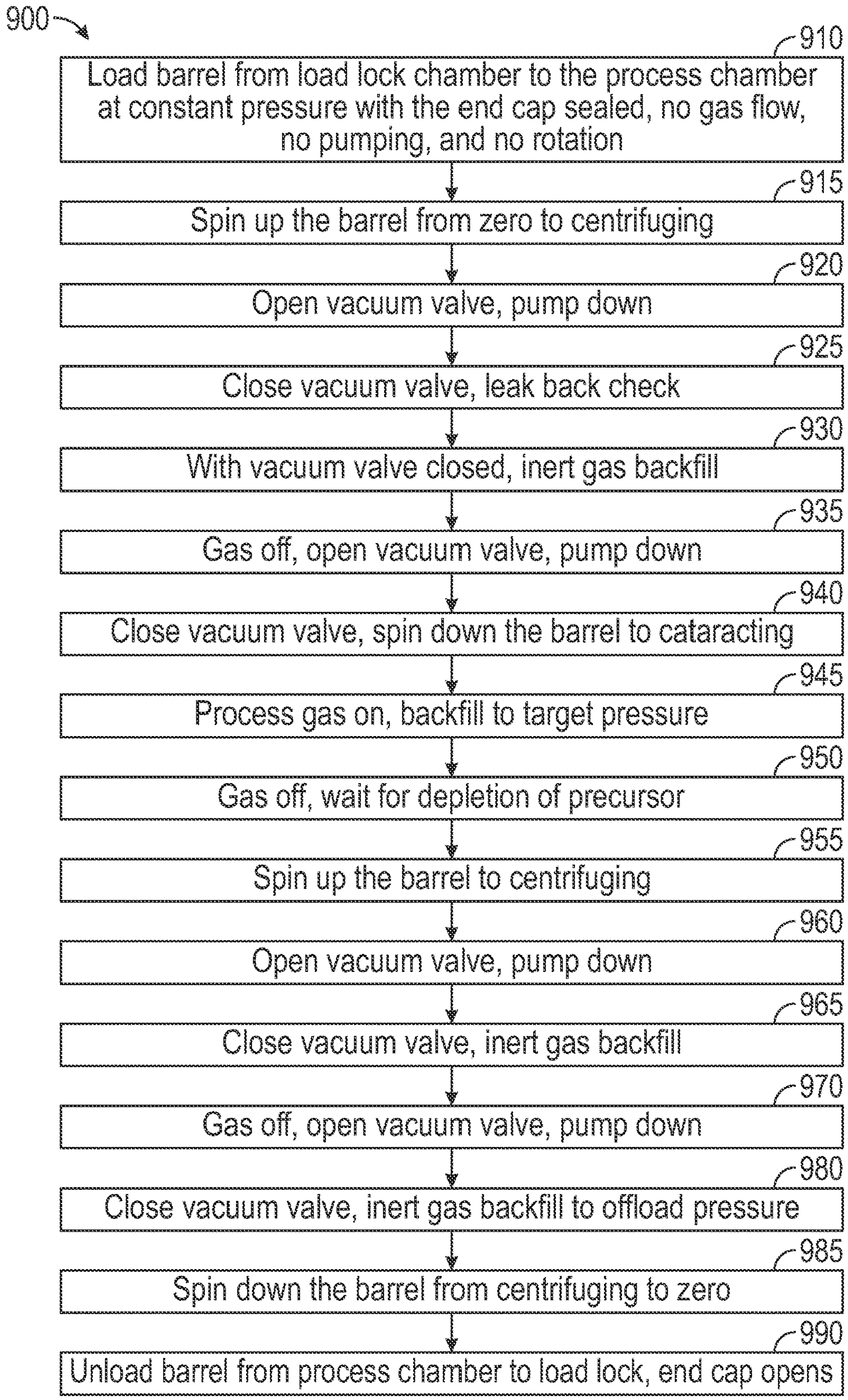
FIG. 15 is a flow chart showing an illustrative method of powder processing in accordance with this disclosure.

FIG. 15 shows a flow chart for another illustrative method (900) in accordance with the present disclosure that can be used to carry out a process employing the pressures and velocities of FIG. 14. The method includes at step 910 loading a first barrel containing powder for treatment from the load lock chamber to the process chamber at constant pressure with the end cap sealed, no gas flow, no pumping, and no rotation of the barrel. At step 915, the barrel begins to spin, going from zero spin to a spinning at a speed sufficient to provide a centrifuging condition. A vacuum valve is closed, and the process tube and barrel are pumped down at step 920. With the vacuum valve still closed, a leak back check is performed (step 925), and then, at step 930, the process tube and barrel are backfilled with inert gas. At step 935, the flow of gas is shut off, the vacuum valve is opened, and the process tube and barrel are pumped down. It should be understood that steps 930 and 935 may be repeated as many times as necessary to pump-purge the process tube and barrel. It also should be understood that if the load lock chamber has been pump-purged sufficiently prior to loading the barrel into the reactor, steps 930 and 935 may not be necessary.

At step 940, the vacuum valve is closed, and the rotation of the barrel is slowed down to create a cataracting condition within the barrel. Once a cataracting condition is achieved, process gas is turned on and the process tube and barrel are backfilled to a target pressure for treatment (945). At step 950, with the flow of process gas turned off, treatment continues until the depletion of precursor is achieved. Once the precursor is depleted, at step 955, the rotation speed of the barrel is increased to achieve a centrifuging condition. The vacuum valve is opened, and the process tube and barrel are pumped down at step 960. It should be understood that steps 940 through 960 may be repeated as many times as necessary to complete the powder processing.

At step 965, the vacuum valve is closed, and the process tube and barrel are backfilled with inert gas. The flow of gas is turned off, the vacuum valve is opened, and the process tube and barrel are pumped down at step 970. It should be understood that steps 965 and 970 may be repeated as many times as necessary to pump-purge the process tube and barrel.

At step 975, the vacuum valve is closed, and inert gas is backfilled to offload pressure within the process tube and barrel. The rate of rotation of the barrel is then reduced from a centrifuging speed to zero at step 980. The barrel is unloaded from the process chamber and moved to the load lock chamber at step 990, at which time the hinged door to the load lock chamber can be opened. Care should be taken to minimize pressure differential between the load lock chamber and process chamber when the hinged door opens. Alternatively, the barrel may continue to rotate at a centrifuging speed during unload from the process chamber to the load lock chamber.

This written description uses examples to describe the present powder treatment system and processes to enable any person skilled in the art to make and use any devices or systems and perform any incorporated methods. The scope of the disclosure may include other examples that occur to those skilled in the art. Such other examples are intended to be within the scope of this disclosure if they include structural elements that do not differ from the explicitly disclosed embodiments, or if they include equivalent structural elements with insubstantial differences from the explicitly disclosed embodiments.

It should be understood that various aspects disclosed herein may be combined in different combinations than the combinations specifically presented in the description and accompanying drawings. It should also be understood that, depending on the example, certain acts or events of any of the processes or methods described herein may be performed in a different sequence, may be added, merged, or left out altogether (e.g., all described acts or events may not be necessary to carry out the techniques). In addition, while certain aspects of this disclosure are described as being performed by a single module or unit for purposes of clarity, it should be understood that the techniques of this disclosure may be performed by a combination of units or modules associated with a particle treatment system.

What is claimed is:

1. A system for processing powder comprising:

a process tube connected to a load lock chamber via a vacuum valve, the load lock chamber including first and second stations, each of the first and second stations configured to receive a barrel containing powder to be treated; and a mechanical transfer mechanism configured to:

move a barrel containing powder to be treated from the first station into the process tube;

move a barrel containing powder to be treated from the second station into the process tube;

move a barrel containing treated powder from the process tube to the first station; and move a barrel containing treated powder from the process tube to the second station.

2. The system according to claim 1, wherein the process tube includes a stationary thermocouple, a stationary gas injector, and an exhaust port.

3. The system according to claim 1, further comprising a rotary shaft configured to advance a barrel containing powder to be treated from the first station into the process tube and to rotate the barrel once positioned within the process tube.

4. The system according to claim 1, further comprising a heater to maintain the process chamber substantially at treatment temperature at all times during barrel movement.

5. The system according to claim 1, wherein the mechanical transfer mechanism is a linear transfer mechanism.

6. The system according to claim 1, wherein the mechanical transfer mechanism includes a transfer arm configured to receive a barrel.

7. The system according to claim 5, wherein the mechanical transfer mechanism includes an elevator configured to receive the barrel from the transfer arm.

8. The system according to claim 1, wherein the process tube is configured to provide one or more treatment processes selected from chemical vapor deposition (CVD), or atomic layer deposition.

9. A system for processing powder comprising:

a process tube connected to a load lock chamber via a vacuum valve, the load lock chamber including first and second stations, each of the first and second stations configured to receive a barrel containing powder to be treated; and a linear transfer mechanism including a transfer arm having a rotary shaft configured to:

move a barrel containing powder to be treated from the first station into the process tube;

move a barrel containing powder to be treated from the second station into the process tube;

move a barrel containing treated powder from the process tube to the first station; and move a barrel containing treated powder from the process tube to the second station, wherein once the barrel containing powder to be treated is moved from the first station into the process tube, the rotary shaft rotates the barrel within the process tube, and wherein the process tube is configured to provide one or more treatment processes selected from chemical vapor deposition (CVD), or atomic layer deposition.

10. The system according to claim 9, wherein the process tube includes a stationary thermocouple, a stationary gas injector, and an exhaust port.

11. The system according to claim 9, further comprising a heater to maintain the process chamber substantially at treatment temperature at all times during barrel movement.

* * * * *